(12) United States Patent
Dono et al.

(10) Patent No.: US 7,551,502 B2
(45) Date of Patent: Jun. 23, 2009

(54) SEMICONDUCTOR DEVICE

(75) Inventors: Chiaki Dono, Tokyo (JP); Yasuji Koshikawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 245 days.

(21) Appl. No.: 11/434,897

(22) Filed: May 17, 2006

(65) Prior Publication Data
US 2006/0262625 A1 Nov. 23, 2006

(30) Foreign Application Priority Data
May 18, 2005 (JP) ............................. 2005-144942

(51) Int. Cl.
*G11C 7/00* (2006.01)
(52) U.S. Cl. .............. 365/222; 365/233.18; 365/230.09
(58) Field of Classification Search ................ 365/222, 365/230.6, 230.9
See application file for complete search history.

(56) References Cited

U.S. PATENT DOCUMENTS

| | | | |
|---|---|---|---|
| 7,248,528 B2 * | 7/2007 | Riho et al. ................... | 365/222 |
| 2003/0063512 A1 * | 4/2003 | Takahashi et al. ........... | 365/222 |
| 2004/0076054 A1 * | 4/2004 | Takahashi .................... | 365/200 |
| 2005/0243629 A1 * | 11/2005 | Lee .............................. | 365/222 |

FOREIGN PATENT DOCUMENTS

| | | |
|---|---|---|
| JP | 4-10297 | 1/1992 |
| JP | 8-306184 | 11/1996 |

* cited by examiner

*Primary Examiner*—VanThu Nguyen
*Assistant Examiner*—Han Yang
(74) *Attorney, Agent, or Firm*—Sughrue Mion, PLLC

(57) ABSTRACT

Double refresh executing means is changed in accordance with a manner (distributed refresh or burst refresh) of a refresh command so as to suppress a drop of internal power supply that occurs upon double refresh.

8 Claims, 5 Drawing Sheets

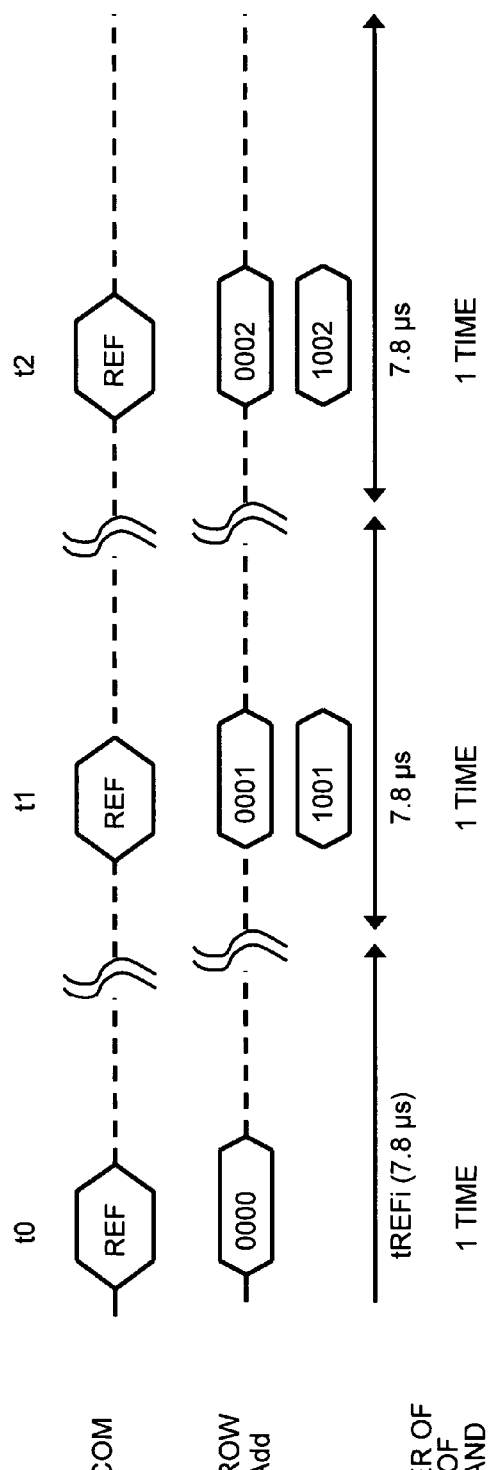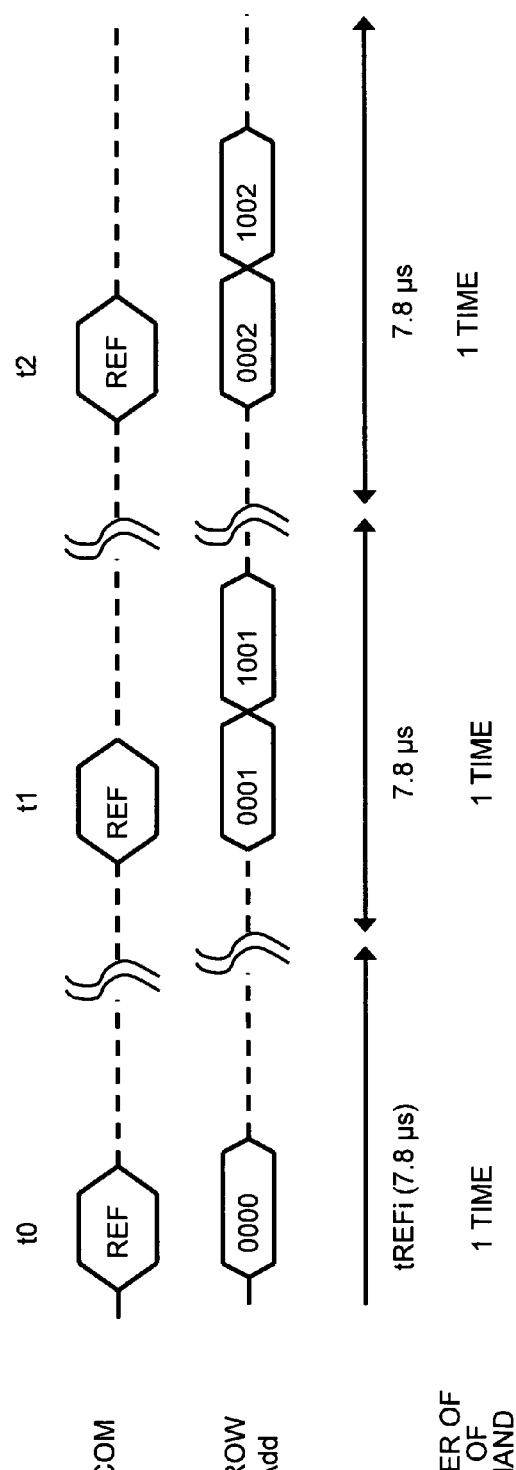

SEMICONDUCTOR DEVICE

This application claims priority to prior Japanese patent application JP 2005-144942, the disclosure of which is incorporated herein by reference.

BACKGROUND OF THE INVENTION

1. Field of the Invention

The present invention relates to a semiconductor device, and more particularly to a semiconductor device capable of changing refresh cycles.

2. Description of the Related Art

A dynamic random access memory (hereinafter, referred to as "DRAM") is a kind of a semiconductor device that has large capacity and allows random accesses. DRAM stores information in the form of the charge amount stored in its capacitor, and thus, it requires a refresh operation to read and amplify the charge amount before it is lost so as to maintain the original state. The time (referred to as "information holding time" or "retention time") until the charge amount stored in the capacitor of the memory cell in the DRAM is lost varies depending on memory cells.

The memory cells are distributed continuously from those having short retention time to those having long retention time. The retention time varies primarily because the charge amount of "HIGH data" written into a memory cell is lost due to junction leakage, although it is also affected by surface leakage, or the relation with other neighboring cells. Most memory cells have long retention time. However, a small number of memory cells have short retention time. The cells having such short retention time are saved by replacing them by redundant memory cells. Due to the limited number of redundant circuits, however, some of the memory cells having short retention time may remain unsaved.

The presence of a memory cell having such short retention time causes a defective semiconductor device that does not meet the standards. This leads to degradation of product yields, and an increase of product cost. In order to solve these problems, there is a method of providing a great number of redundant circuits to save all the memory cells having short retention time. If a large number of redundant circuits are provided, however, the chip area of the semiconductor device increases, which would rather increase the product cost.

Techniques to address such a problem are proposed, e.g., in Japanese Patent Laid-Open No. 04-010297 (Patent Document 1) and Japanese Patent Laid-Open No. 08-306184 (Patent Document 2). In a semiconductor device described in Patent Document 1, refresh is carried out more frequently for a specific cell having short retention time than other cells to save the specific cell, to thereby reduce the chip area and decrease the cost. In Patent Document 2, an address of a memory cell having short retention time is stored in a fuse circuit group, to refresh a semiconductor device both in a long period and a short period. For the memory cell to which refresh of the long period is designated, refresh of the short period is skipped, to thereby perform refresh of short period or long period in accordance with the fuse circuit information. According to these documents, short period refresh can be performed on memory cells having short retention time, so as to save them without replacing them by redundant circuits.

Another way of saving memory cells having short data retention time is double refresh. Double refresh, however, requires activation of word lines twice as many as in normal refresh. Thus, it is necessary to double the supply capacity of a power supply circuit provided inside the chip. In case where the short period refresh is performed with double refresh, the area of the power supply circuit becomes twice that of normal case, which would disadvantageously increase the chip cost.

As described above, the presence of memory cells having short retention time in a semiconductor device problematically causes degradation of the yield. Further, when using double refresh, the power drop inside the chip is large, and the area of the power supply circuit twice that of the normal case is required. This causes the problem of an increased chip cost. Therefore, there is a demand for a double refresh operation suitable for an input manner of the refresh command so as to suppress power supply drop inside the chip.

Further, in contrast to burst refresh in DDR2, in the case of SDRAM prior to DDR1, the number of consecutive refresh commands is determined by the number of refresh cycles described in a data sheet of DRAM, e.g., 8192 times/64 ms or the like. This means that it is possible to hold data of the memory cells if 8192 refresh commands are input every 64 ms. At this time, although the data of the memory cells can be held either with 8192 times/64 ms or with 4096(=8192/2) times/32(=64/2) ms, 8192 times/64 ms cannot achieve the effect of double refresh. This is because the memory cells cannot be refreshed every 32 ms. The effect of double refresh is achieved when the refresh commands are provided at K=2 or greater for 8192÷K times/64÷K (ms). Accordingly, in the SDRAM prior to DDR1, there may be a case where the effect of double refresh cannot be obtained depending on the input manner of refresh commands by a user. Meanwhile, in the SRAM defined by the standards after DDR2, only eight or less refresh commands can be input consecutively in the manner of burst refresh. Thus, double refresh can be used to obtain the effect of short period refresh.

SUMMARY OF THE INVENTION

In view of the foregoing, the object of the present invention is to provide a refresh method and a semiconductor device that can save memory cells having short retention time by selecting double refresh operation executing means in accordance with the input manner of the refresh commands, so as to suppress power supply drop within the chip when double refresh is employed to refresh the memory cells having short retention time at a short refresh period.

To achieve the above-described object, the present invention basically employs the aspects as follows.

According to a first aspect of the present invention, there is provided a semiconductor device using double refresh and having double refresh executing means, wherein the double refresh executing means is changed in accordance with a manner (distributed refresh or burst refresh) of a refresh command.

Preferably, the double refresh executing means includes first double refresh executing means, operative in case where a pair of addresses selected by an address selector in a cycle in which the refresh command is input requires a double refresh operation, for interrupting a normal refresh operation when a next refresh command is input, to perform the double refresh operation for the pair of addresses.

Preferably, when the pair of addresses selected by the address selector requires the double refresh operation, the first double refresh executing means causes the address selector to stop counting up of the address when the next refresh command is input and hold the address selected when a preceding refresh command is input.

Preferably, the double refresh executing means includes second double refresh executing means, operative in case where a pair of addresses selected by an address selector in a cycle in which the refresh command is input requires a double refresh operation, for performing the double refresh operation for the pair of addresses in the same refresh cycle as the input refresh command.

Preferably, the second double refresh executing means refreshes a word line having the address selected by the address selector and a pair word line in parallel simultaneously.

Preferably, the second double refresh executing means refreshes a word line having the address selected by the address selector and a pair word line in a time-sharing parallel manner within the same refresh cycle as the input refresh command.

According to a second aspect of the present invention, there is provided a semiconductor device, comprising:

a multiplex refresh control circuit that determines a manner of an input refresh command and determines whether a pair of addresses requires double refresh or not, and selects as refresh executing means, normal refresh executing means, or first double refresh executing means for inserting a double refresh operation for the pair of addresses when a next refresh command is input, or second double refresh executing means for performing the double refresh operation for the pair of addresses in the same refresh cycle as the input refresh command.

Preferably, the multiplex refresh control circuit counts the number of refresh commands input per unit time to recognize the manner of the refresh command, and selects the refresh executing means.

Preferably, a timer for counting the unit time also serves as a self-refresh timer.

Preferably, the multiplex refresh control circuit selects the second double refresh executing means when the refresh command designates distributed refresh and double refresh is required.

Preferably, the multiplex refresh control circuit initially selects the second double refresh executing means when the refresh command designates burst refresh and double refresh is required, and selects the first double refresh executing means when the double refreshes of N times are performed in succession.

Preferably, the multiplex refresh control circuit selects the refresh executing means by counting the number of refresh commands input per unit time and by counting the number of times of continuous double refreshes.

According to a third aspect of the present invention, there is provided a refresh method of a semiconductor device having a memory cell arranged at each crossing point of a word line and a bit line, the method comprising the steps of:

storing a word line address having short retention time;

counting up and generating a word line address by a refresh command;

determining a refresh method by comparing the generated word line address with the word line address having the short retention time; and refreshing a word line selected by the generated word line address, or refreshing the word line selected by the generated word line address and a pair word line thereof.

Preferably, the refresh method, comprising the steps of:

refreshing the word line selected by the generated word line address by an input refresh command; and refreshing the pair word line of the word line selected by the generated word line address by a refresh command input next to the input refresh command.

Preferably, the counting up of the word line address is stopped when refreshing the pair word line.

In the semiconductor device employing double refresh, an optimal double refresh operation is determined in accordance with the input manner of the refresh commands. Thus, it is possible to obtain a refresh method and a semiconductor device that can suppress a decrease of an internally generated power supply voltage VPP and that can improve refresh characteristics by double refresh.

BRIEF DESCRIPTION OF THE DRAWINGS

FIG. 1A shows a timing chart of parallel refresh according to a refresh method of a first embodiment;

FIG. 1B shows a timing chart of time-sharing parallel refresh according to a refresh method of a first embodiment;

DESCRIPTION OF THE PREFERRED EMBODIMENTS

Hereinafter, a refresh method and a semiconductor device provided with the refresh method of the present invention will be described with reference to the drawings.

First Embodiment

Figure 5:
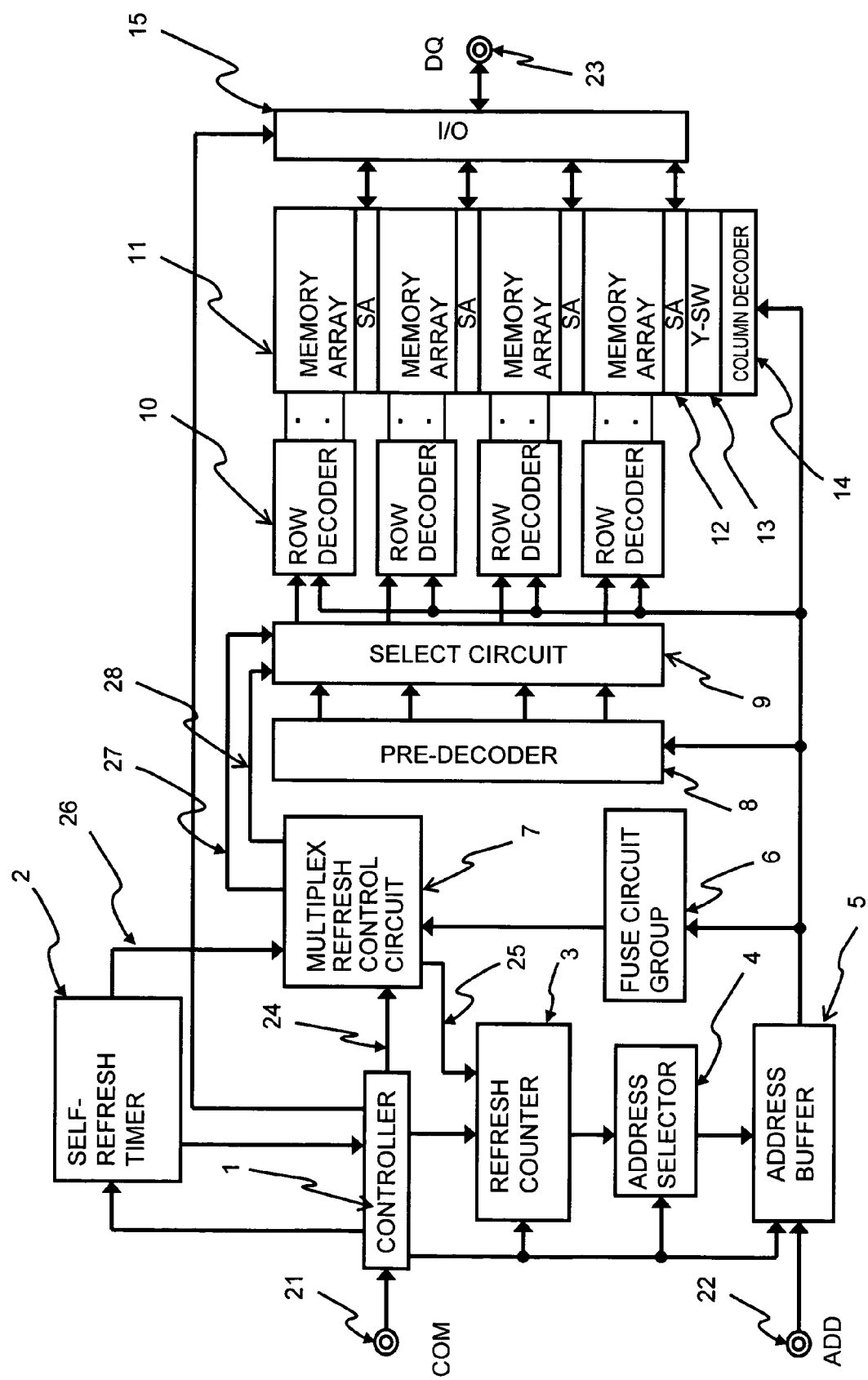
FIG. 5 is a schematic block diagram of a semiconductor device according to the present invention.

A first embodiment of the present invention will now be described with reference to FIGS. 1A, 1B and 5. In the present embodiment, double refresh is performed in distributed refresh, to save memory cells having short retention time. Distributed refresh is a manner of refresh in which a refresh command REF is input once at a maximum interval (tREFi). For example, the refresh commands are issued from a memory controller (outside the chip) every 7.8 µs. By comparison, a manner of refresh in which at least two refresh commands REF are input in succession at minimum intervals (tRFC) to perform continuous refresh is referred to as burst refresh. In burst refresh, the refresh commands are issued from a memory controller (outside the chip) every 105 ns, for example.

A multiplex refresh control circuit counts the number of refresh commands REF to identify distributed refresh or burst refresh as the manner of refresh. At this time, a self-refresh timer, which will be described later, may be commonly used for a timer counting the time. FIG. 1A shows a timing chart of parallel refresh according to a refresh method of the first embodiment while FIG. 1B shows a timing chart of time-sharing parallel refresh according to a refresh method of the first embodiment. Herein, the case of refreshing a word line and its pair word line in one refresh command cycle is collectively referred to as parallel refresh. The case of refreshing the word line and the pair word line approximately at the same time is referred to as parallel refresh, while the case of refreshing them in parallel in a time-sharing manner is referred to as time-sharing parallel refresh. Meanwhile, double refresh that is inserted into a following refresh command cycle is referred to as serial refresh, which will be described later. FIG. 5 is a schematic block diagram of a semiconductor device according to the present application. FIG. 5 shows only a configuration part related to the present invention. The configuration identical to that of a typical semiconductor device is not shown.

The semiconductor device of the present application includes a controller 1, a self-refresh timer 2, a refresh counter 3, an address selector 4, an address buffer 5, a fuse circuit group 6, a multiplex refresh control circuit 7, a pre-decoder 8, a select circuit 9, a row decoder 10, a memory array 11, a sense amplifier 12, a Y switch 13, a column decoder 14, and an I/O circuit 15. The present application is characterized particularly by provision of fuse circuit group 6, multiplex refresh control circuit 7 and select circuit 9.

Controller 1 decodes a command COM input via an external input terminal 21 and transmits control signals to the respective blocks in accordance with the command, to control various operations of the semiconductor device. Self-refresh timer 2 is a timer for counting refresh intervals. Refresh counter 3 counts up the number of times of refresh, and is reset when it comes to a preset number of times and restarts counting up from the beginning. Address selector 4 automatically generates an address to be refreshed, in accordance with the count of the refresh counter. Address buffer 5 receives an address from external input terminal 12 or from the address selector, and outputs the address to the decoders and the fuse circuit group.

Fuse circuit group 6 stores a row address of the memory cell having short retention time that should be double refreshed with a short period. Multiplex refresh control circuit 7 receives signals from controller 1, self-refresh timer 2 and fuse circuit group 6, and controls refresh counter 3 and select circuit 9 to select an optimal refresh method. Multiplex refresh control circuit 7 determines a manner of refresh (distributed refresh, burst refresh) of the input refresh command, and also determines whether a pair of addresses requires double refresh, and selects optimal refresh executing means. Pre-decoder 8 constitutes a part of the row decoder, and selects each block of memory array. Select circuit 9 controls row decoder 10 by taking account of control signals INT 27 and MULTI 28 from multiplex refresh control circuit 7 in addition to the output from the pre-decoder.

A plurality of row decoders 10 activate the respective word lines of memory array 11. A plurality of memory arrays 11 each have memory cells arranged in a matrix. With this structure, each memory cell is arranged at a crossing point of word and bit lines. The memory cells arranged need to be refreshed at regular intervals. Each bit line is connected to a sense amplifier SA 12. Each sense amplifier transmits/receives data to/from I/O circuit 15 via YSW 13 selected by column decoder 14. I/O circuit 15 transmits/receives data to/from the outside via a DQ pin 23.

Herein, memory array 11 and row decoder 10 are divided into four blocks. For example, there are 8192 word lines in total, and one block is configured with 2048 word lines. Specifically, word lines 0-2047, 2048-4095, 4096-6143, and 6144-8191 are arranged in the respective blocks. In normal refresh, the word lines are sequentially activated with refresh commands REF and refreshed every 64 ms.

For example, when the memory cells on word line 0003 have short retention time and require short period refresh, word line 0003 is refreshed at the time of refresh thereof, and refreshed additionally at the time of refresh of word line 4099 (4096+0003). In this manner, the short period refresh is carried out every 32 ms. Performing such short period refresh on the memory cells having short retention time can save the memory cells having short retention time. Herein, word line 0003 is referred to as a pair word line of word line 4099 (4096+0003), and vice versa.

Further, word line 0003 may be refreshed at the time of refresh thereof, and additionally at the times of refresh of word line 2051 (2048+0003), word line 4099 (2048×2+0003), and word line 6147 (2048×3+0003). This allows short period refresh at every 16 ms. The word line to be refreshed in accordance with the address automatically generated by address selector 4 and its pair word lines are arranged on different blocks, such that they are refreshed at the same time. This means that at least two blocks are required for the ½ short period refresh, and at least four blocks are required for the ¼ short period refresh. Thus, although memory array 11 and row decoder 10 are herein divided into four blocks, their numbers are not limited thereto.

The word line to be refreshed and its pair word line(s) belong to different blocks, which do not share a sense amplifier, to enable simultaneous refreshing thereof as the short period refresh. Hereinbelow, for the sake of simplification of explanation, it is assumed that double refresh is carried out as the ½ short period refresh, and word lines having their most significant address bits inverted from each other constitute pair word lines. For example, word line "0003" and word line "1003" are pair word lines. Further, address "0003" and word line "0003" are regarded as convertible terms, since a word line is specified by the address.

FIG. 1A shows a timing chart of parallel refresh and FIG. 1B shows a timing chart of time-sharing parallel refresh for double refresh performed within the same refresh cycle, according to the refresh method of the present embodiment. The present embodiment corresponds to distributed refresh, in which a refresh command REF is input once at a maximum interval (tREFi) of 7.8·mu·s, and corresponds to double refresh, in which short period refresh of the ½ period is carried out. In FIG. 1(A), refresh commands REF are input at times t0, t1 and t2, at every refresh period (cycle) of 7.8·mu·s. At time t0, a first address "0000" is input, and the memory cells connected to word line "0000" are refreshed. At this time, the memory cells connected to pair word line "1000" having the pair of addresses have normal retention time. Therefore, double refresh is not carried out.

At time t1, the next address "0001" is input, and the memory cells connected to word line "0001" are refreshed. At this time, the memory cells connected to pair word line "1001" having the pair of addresses have short retention time. Thus, refresh of pair word line "1001" is carried out at the same time. Specifically, the memory cells connected to word line "0001" and pair word line "1001" are parallel refreshed at the same time. This pair word line "1001" is refreshed again when the own address "1001" is selected. The memory cells having short retention time are double refreshed at the refresh period that is half the refresh period of the normal memory cells. Such double refresh can save the memory cells having short retention time.

At time t2, similarly, the address is incremented by one and address "0002" is input, and the memory cells connected to word line "0002" are refreshed. At this time, the memory cells connected to pair word line "1002" having the pair of addresses have short retention time. In this manner, pair word line "1002" is refreshed. This pair word line "1002" is refreshed again when the own address "1002" is selected. Thus, double refresh of half the refresh period of the normal memory cells is carried out. In this manner, the memory cells having short retention time are refreshed twice (double refresh) when the own address is selected and when the pair of addresses is selected. Such double refresh can save the memory cells having short retention time.

FIG. 1B shows the case of performing double refresh in a time-sharing parallel manner. Refresh commands REF are input at times t0, t1 and t2, at every refresh period (cycle) of 7.8·mu·s. At time t0, a first address "0000" is input, and the memory cells connected to word line "0000" are refreshed. At this time, the memory cells connected to pair word line "1000" having the pair of addresses have normal retention time, and thus, they are not refreshed.

At time t1, the next address "0001" is input, and the memory cells connected to word line "0001" are refreshed. At this time, the memory cells connected to pair word line "1001" having the pair of addresses have short retention time, and thus, they are refreshed within the same refresh cycle. The memory cells connected to word line "0001" and pair word line "1001" are refreshed in a time-sharing parallel manner. The present case differs from the case of FIG. 1(A) in that the parallel refresh carried out approximately at the same time is changed to the parallel refresh carried out in a time-sharing manner. This pair word line "1001" is refreshed again when the own address "1001" is selected, so that it is double refreshed. For the memory cells having short retention time, double refresh is carried out at the refresh period that is half the refresh period for the memory cells having normal retention time. Such double refresh can save the memory cells having short retention time.

At time t2, similarly, the address incremented by one, "0002", is input, and the memory cells connected to word line "0002" are refreshed. At this time, the memory cells connected to pair word line "1002" having the pair of addresses have short retention time, and thus, time-sharing parallel refresh is carried out. This pair word line "1002" is refreshed again when the own address "1002" is selected, resulting in double refresh at the ½ refresh period with respect to the normal memory cells. In this manner, the memory cells having short retention time are refreshed twice (double refresh) at the time when the own address is selected and at the time when the pair of addresses is selected. Performing such double refresh can save the memory cells having short retention time.

Referring again to FIG. 5, operations of the circuit blocks of the semiconductor device will be described. Refresh command REF is input, and a command of refresh operation is output from controller 1. In accordance with the count from refresh counter 3, address selector 4 generates an address to be refreshed. In the case of FIG. 1, a first address "0000" is generated, which is transmitted to address buffer 5. The address from address buffer 5 is input to fuse circuit group 6, pre-decoder 8 and row decoder 10.

Fuse circuit group 6 compares the input address with address information programmed in the fuse. When the word line having the pair of addresses of the input address requires double refresh, it activates a hit signal. In the case of normal refresh, the hit signal is maintained inactive. In the case of address "0000", the pair of addresses "1000" requires normal refresh, and the hit signal remains inactive. Thus, word line "0000" is refreshed in accordance with the address input to pre-decoder 8 and row decoder 10.

After a lapse of a prescribed time, the next refresh time t1 arrives. A carry signal 26 is output from self-refresh timer 2. Controller 1 that has received carry signal 26 and refresh command REF causes refresh counter 3 to increment the count by one and output it to address selector 4. Address selector 4 increments the address by one to designate address "0001". Address "0001" is transmitted to address buffer 5. The address from address buffer 5 is input to fuse circuit group 6, pre-decoder 8 and row decoder 10.

Fuse circuit group 6 compares the input address with the address information programmed in the fuse. When the word line having the pair of addresses of the input address requires double refresh, it activates a hit signal. In the case of normal refresh, it maintains the hit signal inactive. In the case of address "0001", the pair of addresses "1001" requires double refresh, and thus, the hit signal is activated. Multiplex refresh control circuit 7, in receipt of the activated hit signal, outputs control signals INT 27 and MULTI 28 to select circuit 9. Control signals INT 27 and MULTI 28 control the refresh method.

In the case of parallel refresh in FIG. 1A, control signals INT 27 of "L" and MULTI 28 of "H" are output, while in the case of time-sharing parallel refresh in FIG. 1B, control signals INT 27 of "H" and MULTI 28 of "H" are output. With the row decoder controlled by control signals INT 27 and MULTI 28, word line "0001" and pair word line "1001" are activated to be refreshed in parallel or in a time-sharing parallel manner. At this time, although the output of pre-decoder 8 becomes non-selective for the block having pair word line "1001", it is selected by select circuit 9. Thus, it may be configured such that control signals INT 27 and MULTI 28 are input directly to pre-decoder 8.

After a lapse of the prescribed time again, the next refresh time t2 arrives. Carry signal 26 is output from self-refresh timer 2, and carry signal 26 and refresh command REF are input to controller 1. The subsequent block operations are similar to the case of refresh time t1, and thus, detailed description thereof will not be repeated.

In the present embodiment, the address of the word line having memory cells of short retention time is stored in the fuse circuit group, and the stored information is used to refresh the word line also at the time of refresh of the pair word line, to realize the double refresh of the ½ period. The double refresh is carried out in parallel or in a time-sharing parallel manner within the same refresh command cycle. Thus, a refresh method that can save the memory cells having short retention time without replacing them by redundant circuits can be obtained, and a semiconductor device provided with such a refresh method can be obtained.

Second Embodiment

Figure 2A:
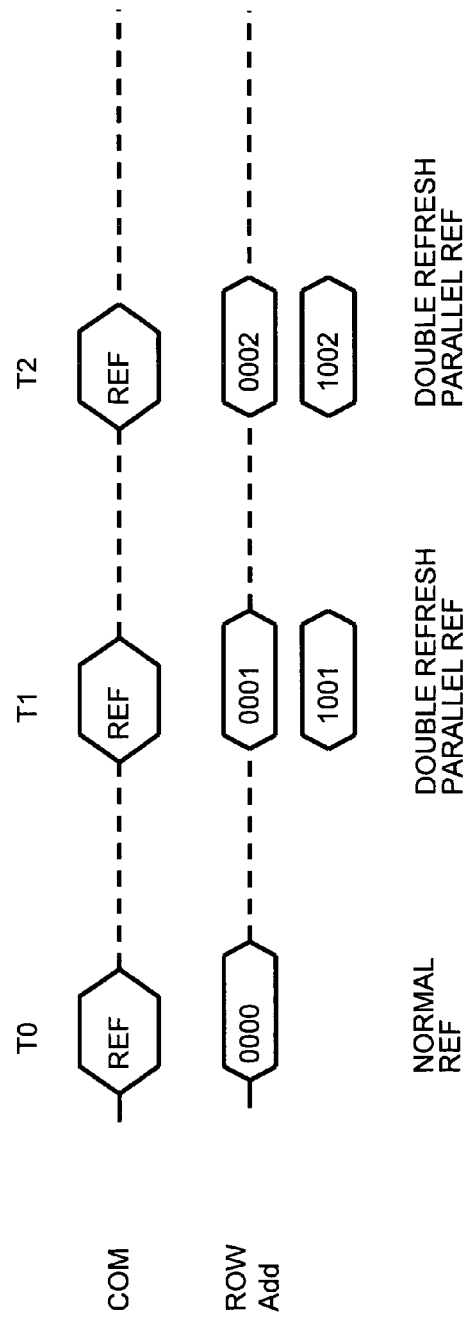
FIG. 2A shows a timing chart of parallel refresh according to a refresh method of a second embodiment.
Figure 2B:
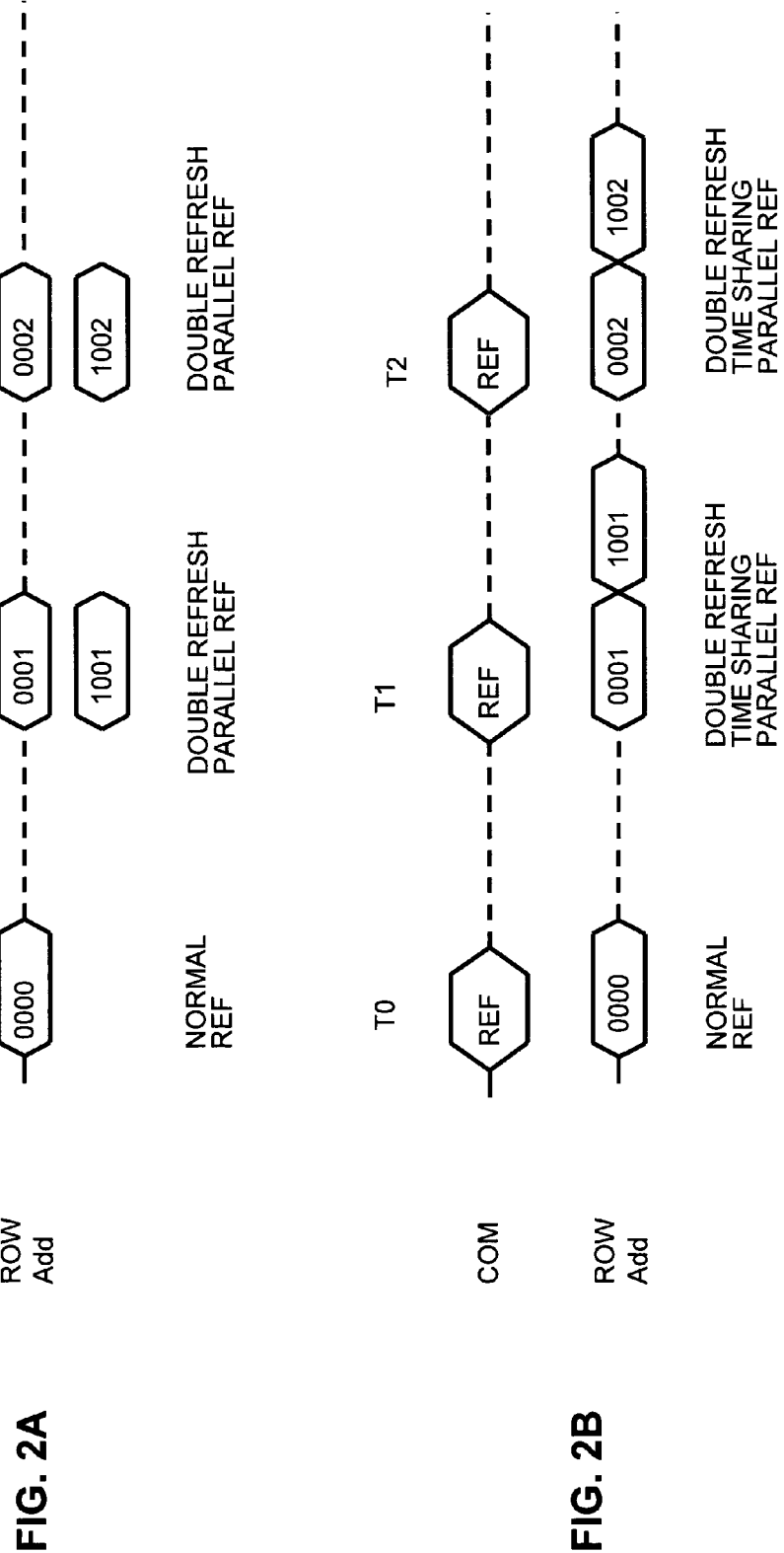
FIG. 2B shows a timing chart of time-sharing parallel refresh according to a refresh method of a second embodiment.

A second embodiment of the present invention will now be described with reference to FIGS. 2A, 2B and 5. In the present embodiment, double refresh is performed in burst refresh, to save memory cells having short retention time. FIG. 2A shows a timing chart of parallel refresh and FIG. 2B shows a timing chart of time-sharing parallel refresh for double refresh performed within the same refresh cycle, according to the refresh method of the present embodiment. FIG. 5 is a schematic block diagram of the semiconductor device according to the present application. In FIG. 2, for the burst refresh, a plurality of refresh commands REF are consecutively input at minimum intervals (tRFC) within a maximum interval (tREFi) of 7.8 µs, to perform refresh operations. For the short period refresh, double refresh of the ½ period is carried out. The minimum interval (tRFC) may be 105 ns, for example, and up to eight refresh commands REF can be input in DDR2.

In FIG. 2A, refresh commands REF are input at times T0, T1 and T2 at the minimum intervals (tRFC) during the refresh period. At time T0, a first address "0000" is input, and the memory cells connected to word line "0000" are refreshed. At this time, the memory cells connected to pair word line "1000" having the pair of addresses have normal retention time, and thus, double refresh is not carried out.

At time T1, the next address "0001" is input, and the memory cells connected to word line "0001" are refreshed. At this time, the memory cells connected to pair word line "1001" having the pair of addresses have short retention time. Thus, refresh is also carried out for pair word line "1001" at the same time. Specifically, the memory cells connected to word line "0001" and pair word line "1001" are parallel refreshed simultaneously. This pairword line "1001" is refreshed again when the own address "1001" is selected. The memory cells having short retention time are double refreshed at the refresh period that is half the refresh period of the normal memory cells. Such double refresh can save the memory cells having short retention time.

At time t2, similarly, the address is incremented by one and address "0002" is input, and the memory cells connected to word line "0002" are refreshed. At this time, the memory cells connected to pair word line "1002" having the pair of addresses have short retention time, and thus, pair word line "1002" is refreshed as well. This pair word line "1002" is refreshed again when the own address "1002" is selected. Thus, double refresh is carried out at half the refresh period of normal memory cells. In this manner, refresh is carried out twice (double refresh) for the memory cells having short retention time, when the own address is selected and when the pair of addresses is selected. Performing such double refresh can save the memory cells having short retention time.

FIG. 2B shows the case of performing double refresh in a time-sharing parallel manner. Refresh commands REF are input at times T0, T1 and T2 at the minimum intervals (tRFC). At time T0, a first address "" is input to perform refresh of the memory cells connected to word line "0000". At this time, the memory cells connected to pair word line "1000" having the pair of addresses have normal retention time, so that they are not refreshed.

At time T1, the next address "0001" is input, and the memory cells connected to word line "0001" are refreshed. At this time, the memory cells connected to pair word line "1001" having the pair of addresses have short retention time. As a consequence, refresh therefor is carried out within the same refresh cycle. Specifically, the memory cells connected to word line "0001" and pair word line "1001" are refreshed in a time-sharing parallel manner. This differs from the case of FIG. 2A in that the parallel refresh conducted approximately at the same time is changed to the time-sharing parallel refresh. This pair word line "1001 " is refreshed again when the own address "1001" is selected, so that double refresh is carried out. With respect to the refresh period for normal memory cells, double refresh is carried out for the memory cells having short retention time at the ½ refresh period. Such double refresh can save the memory cells having short retention time.

At time T2, similarly, the address is incremented by one and address "0002" is input to refresh the memory cells connected to word line "0002". At this time, the memory cells connected to pair word line "1002" having the pair of addresses have short retention time. Thus, time-sharing parallel refresh is carried out. This pair word line "1002" is refreshed again when the own address "1002" is selected. Consequently, double refresh is carried out at the ½ refresh period with respect to the refresh period for the normal memory cells. In this manner, the memory cells having short retention time are refreshed twice (double refresh) when the own address is selected and when the pair of addresses is selected. Such double refresh can save the memory cells having short retention time.

Referring again to FIG. 5, operations of the circuit blocks of the semiconductor device will now be described. Refresh command REF is input, and a command of refresh operation is output from controller 1. In accordance with the count from refresh counter 3, address selector 4 generates an address to be refreshed. Initially, first address "0000" is generated and transmitted to address buffer 5. The address from address buffer 5 is input to fuse circuit group 6, pre-decoder 8 and row decoder 10.

Fuse circuit group 6 compares the input address with address information programmed in the fuse. When the word line of the pair of addresses of the input address requires double refresh, it activates a hit signal. At the time of normal refresh, it maintains the hit signal inactive. In the case of address "0000", the pair of addresses "1000" requires normal refresh, so that the hit signal remains inactive. Thus, word line "0000" is refreshed in accordance with the address input to pre-decoder 8 and row decoder 10.

After a lapse of a prescribed time, the next refresh time T1 arrives. A carry signal 26 is output from self-refresh timer 2, and controller 1 that has received carry signal 26 and refresh command REF causes refresh counter 3 to increment the count by one and output it to address selector 4. Address selector 4 increments the address by one to designate address "0001". Address "0001" is transmitted to address buffer 5. The address from address buffer 5 is input to fuse circuit group 6, pre-decoder 8 and row decoder 10.

Fuse circuit group 6 compares the input address with the address information programmed in the fuse. When the word line having the pair of addresses of the input address requires double refresh, it activates a hit signal, while it maintains the hit signal inactive at the time of normal refresh. In the case of address "0001", the pair of addresses "1001" requires double refresh, and thus, the hit signal is activated. Multiplex refresh control circuit 7 that has received the activated hit signal outputs control signals INT 27 and MULTI 28 to select circuit 9. Control signals INT 27 and MULTI 28 control the refresh method.

INT 27 of "L" and MULTI 28 of "H" are output in the case of the parallel refresh in FIG. 2(A), while INT 27 of "H" and MULTI 28 of "H" are output in the case of the time-sharing parallel refresh in FIG. 2B. With the row decoder controlled by control signals INT 27 and MULTI 28, word line "0001" and pair word line "1001" are activated, which are refreshed in parallel or in a time-sharing parallel manner. At this time, although the output of pre-decoder 8 becomes non-selective for the block having pair word line "1001", it is selected by select circuit 9. Thus, it may be configured such that control signals INT 27 and MULTI 28 are directly input to pre-decoder 8.

After a lapse of the prescribed time again, the next refresh time T2 arrives. Self-refresh timer 2 outputs carry signal 26, and carry signal 26 and refresh command REF are input to controller 1. The subsequent block operations are similar to the case of refresh time T1. Thus, detailed description thereof will not be repeated.

In the present embodiment, the address of the word line having memory cells having short retention time is stored in the fuse circuit group, and the stored information is used to refresh the relevant word line also at the time of refresh of its pair word line, to thereby realize the double refresh of the ½ period. The double refresh is performed in parallel or in a time-sharing parallel manner within the same refresh command cycle. Thus, it is possible to obtain a refresh method that can save the memory cells having short retention time without replacing them by redundant circuits. Further, it is also possible to obtain a semiconductor device provided with this refresh method.

Third Embodiment

Figure 3:
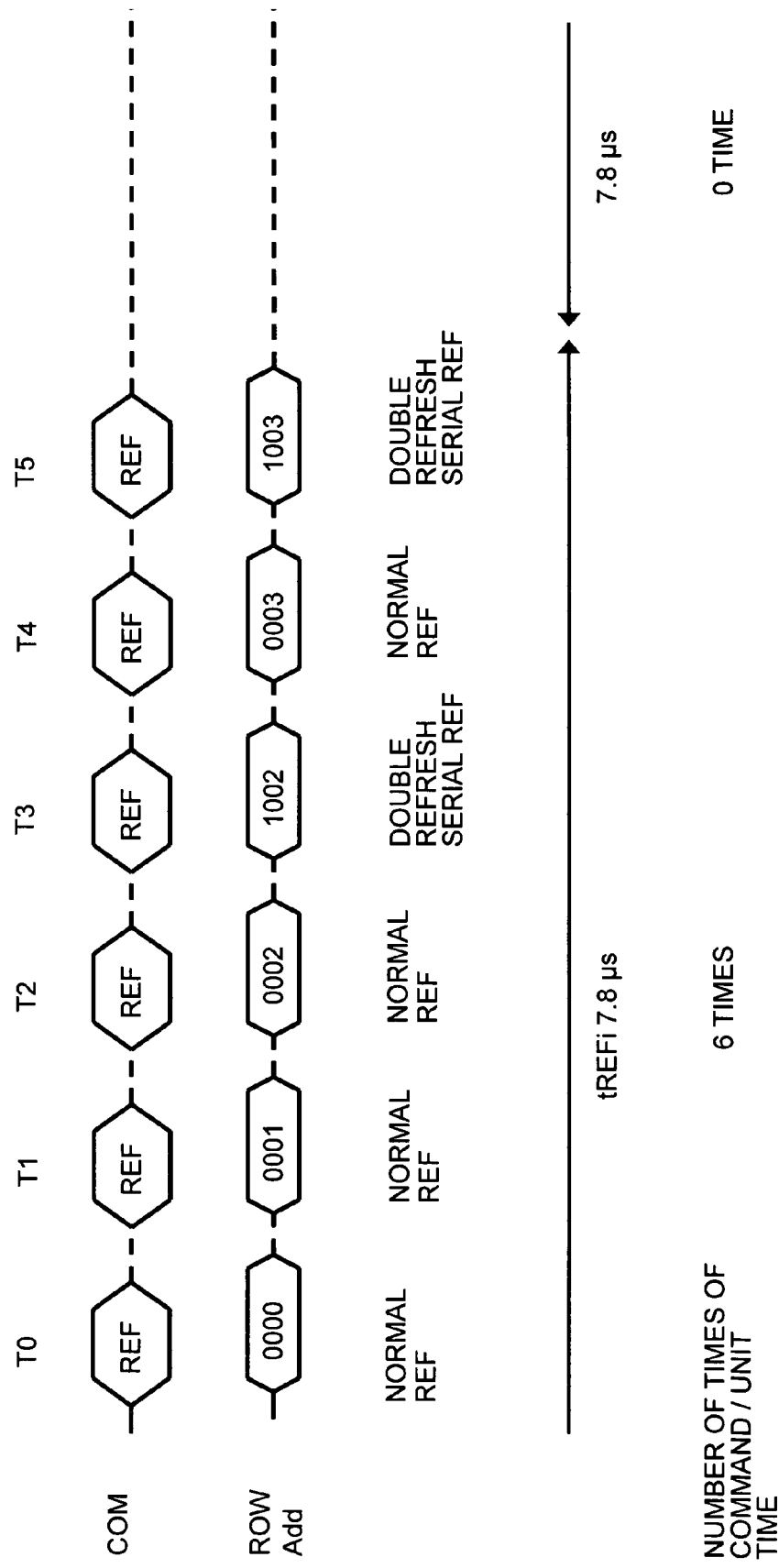
FIG. 3 is a timing chart according to a refresh method of a third embodiment.

A third embodiment of the present invention will now be described with reference to FIGS. 3 and 5. In the present embodiment, in burst refresh, refresh commands (REF) are consecutively input at the minimum intervals (tRFC), and refresh is inserted into a next refresh cycle as double serial refresh. It is referred to as "double serial refresh" because the double refresh is inserted into the next refresh cycle. FIG. 3 shows a timing chart of the double serial refresh according to the present embodiment. FIG. 5 is a schematic block diagram of the semiconductor device according to the present application.

In the timing chart of FIG. 3, six refresh commands REF are input within the maximum interval (tREFi). At time T0, refresh command REF is input, and the word line of the first address "0000" is refreshed. At this time, the pair word line "1000" is not an object of double refresh, and thus, refresh is not carried out. At time T1, refresh command REF is input again, and the word line of address "0001" is refreshed. At this time, the pair word line "1001" is not an object of double refresh, and thus, refresh is not carried out.

At time T2, refresh command REF is input, and the word line of address "0002" is refreshed. At this time, the pair word line "1002" is an object of double refresh, and thus, pair word line "1002" is refreshed at time T3 when the fourth refresh command REF is input. Specifically, word line "0002" is refreshed at time T2 when the third refresh command REF is input, and its pair word line "1002" is refreshed in a serial manner at time T3 when the fourth refresh command REF is input. At time T4, the fifth refresh command REF is input, and address "0003" is refreshed. The pair word line "1003" is an object of double refresh, and thus, pair word line "1003" is refreshed at the next time T5. As the fourth and the sixth refresh commands REF are input at times T3 and T5, respectively, the pair word lines of the word lines selected by the previously input refresh commands REF are serially refreshed by interrupting the next refresh cycles.

Hereinafter, operations of the circuit blocks of the semiconductor device will be described with reference to FIG. 5. The operations at times T0 and T1 are similar to those at time T0 in the second embodiment, and thus, description thereof will not be repeated. At the next time T2, controller 1 that has received refresh command REF causes refresh counter 3 to increment the count by one and output it to address selector 4. Address selector 4 increments the address by one to designate address "0002". Address "0002" is transmitted to address buffer 5. The address from address buffer 5 is input to fuse circuit group 6, pre-decoder 8, and row decoder 10.

Fuse circuit group 6 compares the input address with the address information programmed in the fuse. The word line having the pair of addresses "1002" of the input address requires double refresh, and thus, a hit signal is activated. Multiplex refresh control circuit 7 that has received the activated hit signal selects the double serial refresh method, and outputs control signals INT 27 of "L" and MULTI 28 of "L" to select circuit 9. Further, it outputs a hold signal 25 to refresh counter 3. The control signals cause word line "0002" to be refreshed. At time T3, although the fourth refresh command REF is input, refresh counter 3 does not perform counting up, since it is stopped with hold signal 25. Thus, the output address of the address selector remains "0002". Control signals INT 27 of "H" and MULTI 28 of "L" are output from multiplex refresh control circuit 7, and pair word line "1002" is refreshed. With the refresh of pair word line "1002", hold signal 25 for refresh counter 3 is reset.

At time T4, the fifth refresh command REF is input. With the fifth refresh command REF input, refresh counter 3 increments the count by one, address selector 4 designates address "0003", and fuse circuit group 6 performs the address comparison. Pair of addresses "1003" is an object of double refresh, so that a hit signal is output. Multiplex refresh control circuit 7 that has received the activated hit signal selects the double serial refresh method, and outputs control signals INT 27 of "L" and MULTI 28 of "L" to select circuit 9. It further outputs hold signal 25 to refresh counter 3. Word line "0003" is refreshed with these control signals.

At time T5, the sixth refresh command REF is input. However, refresh counter 3 does not perform counting up, since it is stopped with hold signal 25. Thus, the output address of the address selector remains "0003". Control signals INT 27 of "H" and MULTI 28 of "L" are output from multiplex refresh control circuit 7, and pair word line "1003" is refreshed. With the refresh of pair word line "1003", hold signal 25 for refresh counter 3 is reset.

In the present embodiment, double refresh in the burst refresh is carried out by refreshing the pair of addresses at the time of the next refresh command. In the case where the next period is distributed refresh, however, the refresh method may be changed to the one of the first embodiment where the pair of addresses is refreshed at the time of the own refresh command.

In the present embodiment, in the burst refresh, a word line designated by the refresh command is refreshed. At this time, when the pair word line requires double refresh, a hold signal from the multiplex refresh control circuit hinders counting up of the refresh counter. In response to the refresh command input subsequently, the previous address is output, without the counting up by the refresh counter, so that the pair word line is refreshed. Since the double refresh is carried out by interrupting the next refresh command cycle, a drop of internal power supply that would otherwise occur upon double refresh can be suppressed. Thus, a refresh method that can save the memory cells having short retention time without replacing them by redundant circuits can be obtained. Further, a semiconductor device provided with this refresh method can be obtained.

Fourth Embodiment

Figure 4A:
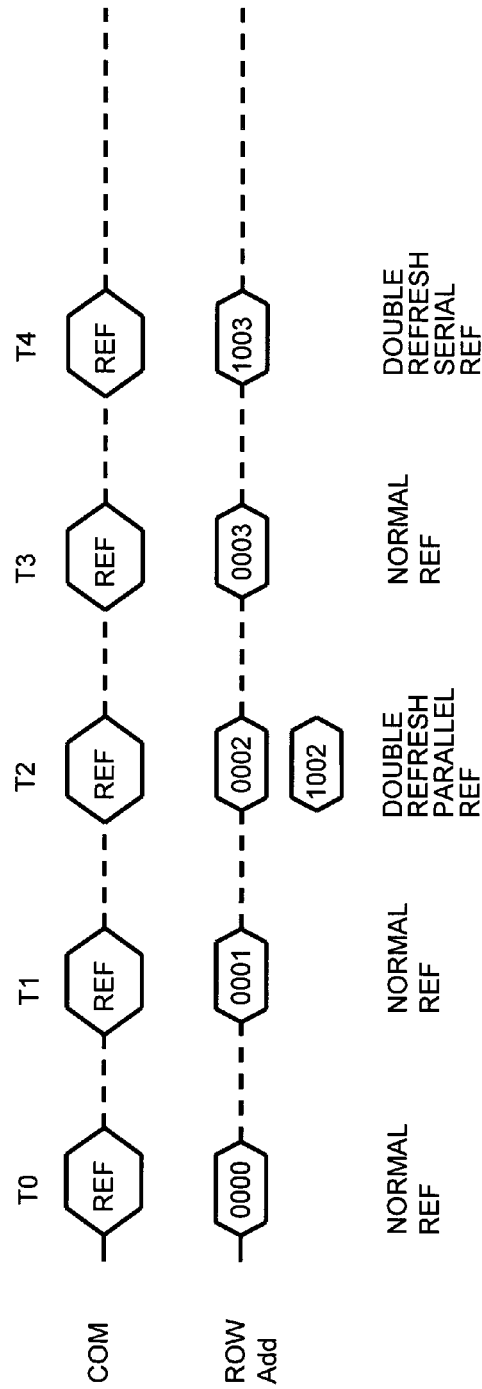
FIG. 4A shows a timing chart of a combination of parallel refresh and serial refresh according to a refresh method of a fourth embodiment.
Figure 4B:
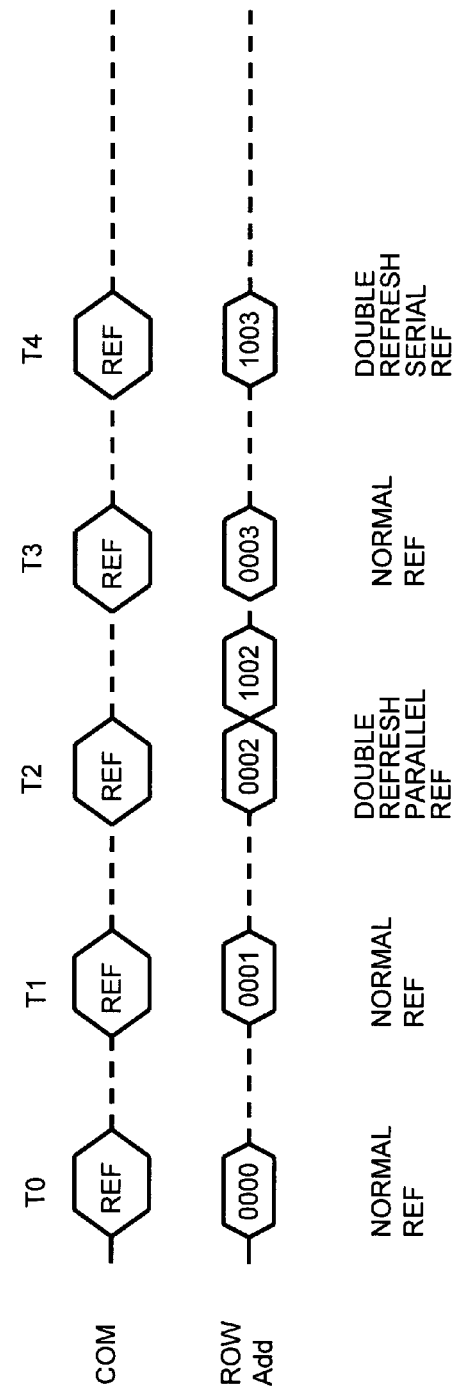
FIG. 4B shows a timing chart of a combination of time-sharing parallel refresh and serial refresh according to a refresh method of a fourth embodiment.

A fourth embodiment of the present invention will now be described with reference to FIGS. 4A, 4B and 5. In the present embodiment, in burst refresh, first double refresh is carried out within one refresh command cycle, and the next double refresh is carried out by interrupting the following refresh command cycle. FIG. 4A shows a timing chart of a combination of parallel refresh and serial refresh according to a refresh method of the fourth embodiment while FIG. 4B shows a timing chart of a combination of time-sharing parallel refresh and serial refresh according to a refresh method of the fourth embodiment. FIG. 5 is a schematic block diagram of the semiconductor device according to the present application. In the third embodiment above, every double refresh is carried out by interrupting the next refresh command cycle. This means that the number of interrupted cycles will increase as the number of cycles to be double refreshed increases. Such an increase of the interrupted cycles leads to elongation of the intended refresh period. The present embodiment is an improved version thereof.

In the timing chart of FIG. 4A, five refresh commands REF are input within a maximum interval (tREFi). At time T0, refresh command REF is input to refresh the word line of a first address "0000". At this time, the pair word line "1000" is not an object of double refresh, and thus is not refreshed. At time T1, refresh command REF is input again to refresh the word line of address "0001". At this time again, the pair word line "1001" is not refreshed, since it is not an object of double refresh.

Next, at time T2, refresh command REF is input, and the word line of address "0002" is refreshed. At this time, the pair word line "1002" is an object of double refresh. Consequently, word line "0002" and pair word line "1002" are parallel refreshed at the same time. At time T3, the fourth refresh command REF is input, and the word line of address "0003" is refreshed. At this time, although the pair word line "1003" is an object of double refresh, it is not refreshed at the same time. Pair word line "1003" is refreshed, when the fifth refresh command REF is input at time T4, in a serial manner by interrupting the next refresh cycle. Herein, the first double refresh is carried out as parallel refresh within the same cycle, and the immediately following, second double refresh is carried out as serial refresh interrupting the next cycle.

In the timing chart in FIG. 4B, five refresh commands REF are input within the maximum interval (tREFi). The present case differs from the case of FIG. 4(A) in that, while double refresh at time T2 is carried out by parallel refreshing word line "0002" and pair word line "1002" at the same time in FIG. 4A, they are refreshed in a time-sharing parallel manner in FIG. 4B. The other timings are similar to those in FIG. 4(A), and thus, description thereof will not be repeated.

Hereinafter, operations of the circuit blocks of the semiconductor device will be described with reference to FIG. 5. The operations at times T0 and T1 are similar to those at time T0 in the second embodiment. Thus, description thereof will not be repeated. At time T2, controller 1 that has received refresh command REF causes refresh counter 3 to increment the count by one and output it to address selector 4. Address selector 4 increments the address by one to designate address "0002". Address "0002" is transmitted to address buffer 5. The address from address buffer 5 is input to fuse circuit group 6, pre-decoder 8 and row decoder 10.

Fuse circuit group 6 compares the input address with the address information programmed in the fuse. The word line having the pair of addresses "1002" of the input address requires double refresh, so that the hit signal is activated. Multiplex refresh control circuit 7 that has received the activated hit signal outputs control signals INT 27 and MULTI 28 to select circuit 9. At this time, multiplex refresh control circuit 7 counts the number of times of double refreshes to determine the position of the relevant double refresh in a series of refresh commands. Herein, it is the double refresh of the first time, and thus, control signals INT 27 and MULTI 28 corresponding to the double refresh of the first time are output. Specifically, in the case of the double parallel refresh in FIG. 4(A), control signals INT 27 of "L" and MULTI 28 of "H" are output. With these control signals, word line "0002" and pair word line "1002" are parallel refreshed at the same time. In the case of the double, time-sharing parallel refresh in FIG. 4(B), control signals INT 27 of "H" and MULTI 28 of "H" are output to the select circuit. With these control signals, word line "0002" and pair word line "1002" are refreshed in succession in a time-sharing parallel manner.

At time T3, the fourth refresh command REF is input. With the fourth refresh command REF input, refresh counter 3 increments the count by one, address selector 4 designates address "0003", and fuse circuit group 6 performs address comparison. The pair of addresses "1003" is an object of double refresh, and thus, a hit signal is output. At this time, multiplex refresh control circuit 7 counts the number of times of double refreshes to determine the position of the relevant double refresh in the series of refresh commands. Herein, it is the second double refresh, and multiplex refresh control circuit 7 that has received the hit signal activated corresponding to the double refresh of the second time selects the double serial refresh method. Multiplex refresh control circuit 7 outputs control signals INT 27 of "L" and MULTI 28 of "L" to select circuit 9, to cause word line "0003" to be refreshed. Multiplex refresh control circuit 7 further outputs hold signal 25 to refresh counter 3.

At time T4, the fifth refresh command REF is input. However, refresh counter 3 does not perform counting up, since it is stopped by hold signal 25. Thus, the output address of the address selector remains "0003". Multiplex refresh control circuit 7 outputs control signals INT 27 of "H" and MULTI 28 of "L", and thus, pair word line "1003" is refreshed. With pair word line "1003" refreshed, hold signal 25 for refresh counter 3 is reset.

Thus, multiplex refresh control circuit 7 counts the number of times of double refreshes to determine the position of the relevant double refresh in a series of refresh commands input within the cycle time, and outputs control signals INT 27 and MULTI 28 corresponding to the count of the double refreshes to select circuit 9. Herein, in the case of the double refresh of the first time, refresh is carried out within the same refresh command cycle. In the case of the double refresh of the second time or later, the double serial refresh method interrupting the next refresh command cycle is selected.

In the present invention, the refresh methods can be selected and performed in accordance with the output levels of control signals INT 27 and MULTI 28. INT 27 of "L" and MULTI 28 of "L" correspond to normal refresh. In the case of double serial refresh, INT 27 of "L" and MULTI 28 of "L" are output at the time of the first refresh command, to refresh the word line selected by the selector. At the time of the next refresh command, INT 27 of "H" and MULTI 28 of "L" are output to refresh the pair word line. In the double parallel refresh, with INT 27 of "L" and MULTI 28 of "H", parallel refresh is carried out approximately at the same time within the same refresh command cycle. In the double, time-sharing parallel refresh, with INT 27 of "H" and MULTI 28 of "H", time-sharing parallel refresh is carried out within the same refresh command cycle. Various kinds of refresh methods may be selected and performed by further combining them.

The refresh methods are changed according to the number of times of double refreshes for the following reasons. On the one hand, in the case where double refresh is performed within the same refresh command cycle, variation in internally generated power supply voltage increases, so that it is necessary to enhance the power supply to continuously perform the double refreshes. On the other hand, in the case of interrupting the next refresh command cycle, the increase in number of times of double refreshes will lead to undesirable elongation of the refresh period from the intended refresh period. When a plurality of times of double refreshes are continued, the supply voltage of the internal power generating circuit will decrease, and thus, in the present embodiment, the double refresh of the second time is carried out by interrupting the next refresh command cycle. However, it may be configured such that the double refresh of up to the third time may be carried out within the same refresh command cycle, and the fourth and later double refresh may be carried out by interrupting the next refresh command cycle. The number of consecutive double parallel refreshes is not restricted particularly, which may be changed as long as the decrease of the internally generated power supply voltage is within the acceptable range.

Performing the double refresh in a parallel manner within the same refresh command cycle prevents the refresh period from being elongated from the intended refresh period. If such double refreshes are continuously performed, however, the supply voltage of the internal power generating circuit will drop. It is necessary to enhance the supply capacity of the internal power generating circuit, which leads to an increase in size of the internal power generating circuit and, hence, an increase of the chip area. Accordingly, the number of times, N, of consecutive double parallel refreshes is determined by the trade off between the supply capacity of the internal power generating circuit and the chip area.

In the present embodiment, in the burst refresh, the number of times of double refreshes is counted to determine the position of the relevant double refresh in the consecutive refresh commands. Control signals INT 27 and MULTI 28 are output to select circuit 9 in accordance with the counted number of times of double refreshes. For the double refresh of up to the N consecutive time, the refresh is carried out within the same refresh command cycle. For the double refresh of the (N+1)-th time or later, the refresh method of interrupting the next refresh command cycle is selected. By performing the double refresh by interrupting the next refresh command cycle, the drop of the internal power supply that would otherwise occur upon double refresh is suppressed. Thus, it is possible to obtain a refresh method that can save the memory cells of short retention time without replacing them by redundant circuits. Further, a semiconductor device provided with such a refresh method can be obtained.

Although the present invention has been explained specifically based on the embodiments, it should be understood that the present invention is not limited to the above-described embodiments, but may be modified in various manners without departing from the sprit thereof, and such modifications are within the scope of the present invention.

What is claimed is:

1. A semiconductor device using double refresh and having double refresh executing means, wherein:
   the double refresh executing means is changed in accordance with a manner of a refresh command;
   the double refresh executing means includes first double refresh executing means, operative in case where a pair of addresses selected by an address selector in a cycle in which the refresh command is input requires a double refresh operation, for interrupting a normal refresh operation when a next refresh command is input, to perform the double refresh operation for the pair of addresses; and
   when the pair of addresses selected by the address selector requires the double refresh operation, the first double refresh executing means causes the address selector to stop counting up of the address when the next refresh command is input and hold the address selected when a preceding refresh command is input.

2. The semiconductor device according to claim 1, wherein:
   the double refresh executing means includes second double refresh executing means, operative in case where a pair of addresses selected by an address selector in a cycle in which the refresh command is input requires a double refresh operation, for performing the double refresh operation for the pair of addresses in the same refresh cycle as the input refresh command.

3. The semiconductor device according to claim 2, wherein the second double refresh executing means refreshes a word line having the address selected by the address selector and a pair word line in parallel simultaneously.

4. The semiconductor device according to claim 2, wherein:
   the second double refresh executing means refreshes a word line having the address selected by the address selector and a pair word line in a time-sharing parallel manner within the same refresh cycle as the input refresh command.

5. A semiconductor device, comprising:
   a refresh address unit producing refresh address information in response to issuance of a refresh command,
   an address storage unit storing redundant address information accompanied with the refresh address information, and
   a refresh control unit performing selected one or ones of first, second and third operations, the first operation being such that a refresh operation responsive to the refresh address information is carried out in parallel to a refresh operation responsive to the redundant address information, the second operation being such that a refresh operation responsive to the refresh address information and a refresh operation responsive to the redundant address information are carried out in sequence prior to subsequent issuance of a refresh command, and the third operation being such that a refresh operation responsive to the refresh address information and a refresh operation responsive to the redundant address information are carried out in response respectively to issuance of a refresh command and subsequent issuance of a refresh command.

6. The device as claimed in claim 5, wherein an address storage unit includes a fuse circuit written with the redundant address information.

7. The device as claimed in claim 5, wherein the refresh control unit further performs a fourth operation in which a refresh operation responsive to the refresh address information is carried out and a refresh operation responsive to the redundant address information is omitted when no redundant address information accompanied with refresh address information to be refreshed is stored in the storage unit.

8. A semiconductor device using double refresh of memory cells comprising:
   a memory controller for generating a refresh command;
   a refresh counter for counting a number of refreshes;
   an address selector for selecting an address to be refreshed in accordance with the count of the refresh counter; and
   a select circuit for selecting an optimal refresh method based on an input manner of the refresh command, the optimal refresh method comprising a first double refresh method in which a normal refresh operation is interrupted when a next refresh command is input to perform refresh for a pair of addresses selected by the address selector;
   wherein the input manner of the refresh command is one of at least a distributed refresh and a burst refresh based on a retention time of the memory cells;
   wherein distributed refresh is the input manner when the memory cells have short retention times; and
   wherein when the first double refresh method is the optimal refresh method, memory cells are refreshed twice, first when the address is selected and second when a normal refresh operation is interrupted to refresh the pair of addresses.

* * * * *